United States Patent
Tinker (10) Patent No.: US 6,362,755 B1
(45) Date of Patent: Mar. 26, 2002

(54) METHOD AND APPARATUS FOR SAMPLE RATE CONVERSION AND APPLICANTS THEREOF

(75) Inventor: Darrell E Tinker, Austin, TX (US)

(73) Assignee: Sigmatel, Inc., Austin, TX (US)

(*) Notice: Subject to any disclaimer, the term of this patent is extended or adjusted under 35 U.S.C. 154(b) by 0 days.

(21) Appl. No.: 09/551,414

(22) Filed: Apr. 18, 2000

(51) Int. Cl.[7] .................................................. H03M 7/00
(52) U.S. Cl. ........................... 341/61; 341/155; 370/545
(58) Field of Search .................... 341/155, 61; 370/545, 370/538, 543, 708, 355

(56) References Cited

U.S. PATENT DOCUMENTS

| | | | |
|---|---|---|---|
| 5,475,628 A | | 12/1995 | Adams |
| 5,489,903 A | * | 2/1996 | Wilson et al. ................. 341/61 |
| 5,497,152 A | * | 3/1996 | Wilson et al. ................. 341/61 |
| 5,818,888 A | | 10/1998 | Holmqvist |
| 5,892,694 A | | 4/1999 | Ott |
| 5,907,295 A | * | 5/1999 | Lin ............................... 341/61 |
| 5,986,589 A | * | 11/1999 | Rosefield et al. .............. 341/61 |
| 6,057,789 A | * | 5/2000 | Lin ............................... 341/61 |
| 6,061,410 A | * | 5/2000 | Linz .............................. 341/61 |
| 6,208,671 B1 | * | 3/2001 | Paulos et al. .................. 341/61 |

* cited by examiner

Primary Examiner—Michael Tokar
Assistant Examiner—Jean Bruner Jeanglaude
(74) Attorney, Agent, or Firm—Timothy W. Markison (57) ABSTRACT

A method and apparatus for converting sample rates of digital signals includes processing that begins by receiving an input data stream at a first sample rate. The processing continues by retrieving predetermined integrated samples at the first sampling rate, where the predetermined integrated samples are derived based on a ratio between the first sampling rate and a second sampling rate. The processing then continues by adjusting the retrieved predetermined integrated samples based on data values of the input data stream to produce adjusted integrated samples. The processing continues by differentiating the adjusted integrated samples to produce an output data stream at an output sample rate, wherein the second sample rate is a multiple of the output sample rate.

26 Claims, 5 Drawing Sheets

METHOD AND APPARATUS FOR SAMPLE RATE CONVERSION AND APPLICANTS THEREOF

TECHNICAL FIELD OF THE INVENTION

This invention relates generally to digital signal processing and more particularly to sample rate conversion.

BACKGROUND OF THE INVENTION

In digital audio applications, an audio Codec (coder/decoder) is required to convert input analog audio signals into digital audio signals and to convert processed digital audio signals into output analog audio signals. Accordingly, the audio Codec includes an analog to digital converter (ADC) to convert the input analog audio signals into the digital input signals and a digital to analog converter (DAC) to convert the processed digital signals into the output analog audio signals.

One implementation of an ADC includes a Sigma Delta modulator that is operably coupled to receive the input analog audio signal and to produce therefrom an oversampled digital signal. A digital decimation filter receives the oversampled digital signal and filters it at a rate that is a fraction, for example $½^n$, of the oversampling rate used by the Sigma Delta modulator. Depending on the desired rate of the digital data, the output of the decimation filter may be the digital output audio signal or the decimation filter output may be further filtered. For an AC97 specification compliant audio Codec, the Codec includes a master clock that operates at a rate of 24.576 MHz. The oversampling rate of the Sigma Delta modulator is produced by dividing the master clock by a factor of n. For example, the oversampling rate may be 12.288 MHz (divide by 2) or 6.144 MHz (divide by 4). The decimation filter of an AC 97 audio Codec may operate at a rate that is $\frac{1}{32}$nd of the oversampling rate. As such the decimation filter outputs a digital data stream at a rate of 384 KHz for a 12.288 MHz oversampling rate and at a rate of 192 KHz for a 6.144 MHz oversampling rate.

Current digital audio rates are specified, for various applications, to be 48 KHz, 44.1 KHz, 22.05 KHz, 16 KHz, 11.025 KHz or 8 KHz. To achieve the 48 KHz sampling rate, the output digital data stream of the decimation filter is further filtered at a rate that is a fraction of the rate used by the decimation filter. As such, to achieve the 48 KHz output, the further filtering divides the decimation filter rate by 8 for the 384 KHz rate. To achieve a 48 KHz output stream when the oversampling rate is 6.144 MHz, the rate of the decimation filter may be adjusted to produce a 384 KHz data stream and the further filtering would be the same as just discussed. To achieve the 24 KHz output rate, the rate of the decimation filter rate is adjusted such that the further filtering stage produces a $⅛^{th}$ of the rate of the decimation filter. To obtain other output rates with the further filtering remaining a divide by 8 rate converter, the rate of the decimation filter is changed. For example, if the output sample rate is 16 KHz, the decimation filter rate would be a divide by 96 for a 12.288 MHz oversampling rate and would be a divide by 48 for a 6.144 MHz.

The rates of 44.1 KHz, 22.05 KHz and 11.025 KHz cannot be directly obtained by dividing the master clock by an integer. To obtain such rates, sample rate conversion is employed. One known sample rate conversion technique determines an integer ratio between a $½^n$ multiplier rate and the desired rate. The numerator of the ratio is used to upscale the oversampling rate of the Sigma Delta modulator and the denominator of the ratio is used to divide the resultant to obtain the new oversampling rate. For example, assume that the $½^n$ multiplier rate corresponds to 48 KHz and the desired rate is 44.1 KHz. An integer ratio of N to M for 44.1 to 48, equals 147 to 160. For this example, the oversampling rate to produce a 48 KHz output is upscaled by 147. For an oversampling rate of 12.288 MHz, the upscaled rate is approximately 1.8 GHz. The converted oversampling rate equals 1.8 GHz divided by 160 which is approximately 11.29 MHz. With this converted oversampling rate, $½^n$ multipliers may be used to obtain the desired output rates.

While the above described implementation works, it is impractical for commercial grade audio Codecs due to the costs associated with a 1.8 GHz clock. Therefore, a need exists for a sample rate conversion technique that is commercially viable for AC97 and other types of audio Codec.

DETAILED DESCRIPTION OF A PREFERRED EMBODIMENT

Generally, the present invention provides a method and apparatus for converting sample rates of digital signals. Such a method and apparatus includes processing that begins by receiving an input data stream at a first sample rate (e.g., oversampling rate of a Sigma Delta modulator). The processing continues by retrieving predetermined integrated samples at the first sampling rate, where the predetermined integrated samples are derived based on a ratio between the first sampling rate and a second sampling rate (e.g., the oversampling rate times the ratio of N to M). The processing then continues by adjusting the retrieved predetermined integrated samples based on data values of the input data stream to produce adjusted integrated samples. The processing continues by differentiating the adjusted integrated samples to produce an output data stream at an output sample rate, wherein the second sample rate is a multiple of the output sample rate. For example, the first sampling rate may be 12.288 MHz and the second sampling rate may be 11.29 MHz (which is based on an N of 147 and a M value of 160) to achieve an output sample rate of 44.1 KHz. With such a method and apparatus, sample rate conversion of digital signals may be achieved in an economical and efficient manner for all types of audio processing applications.

Figure 1:
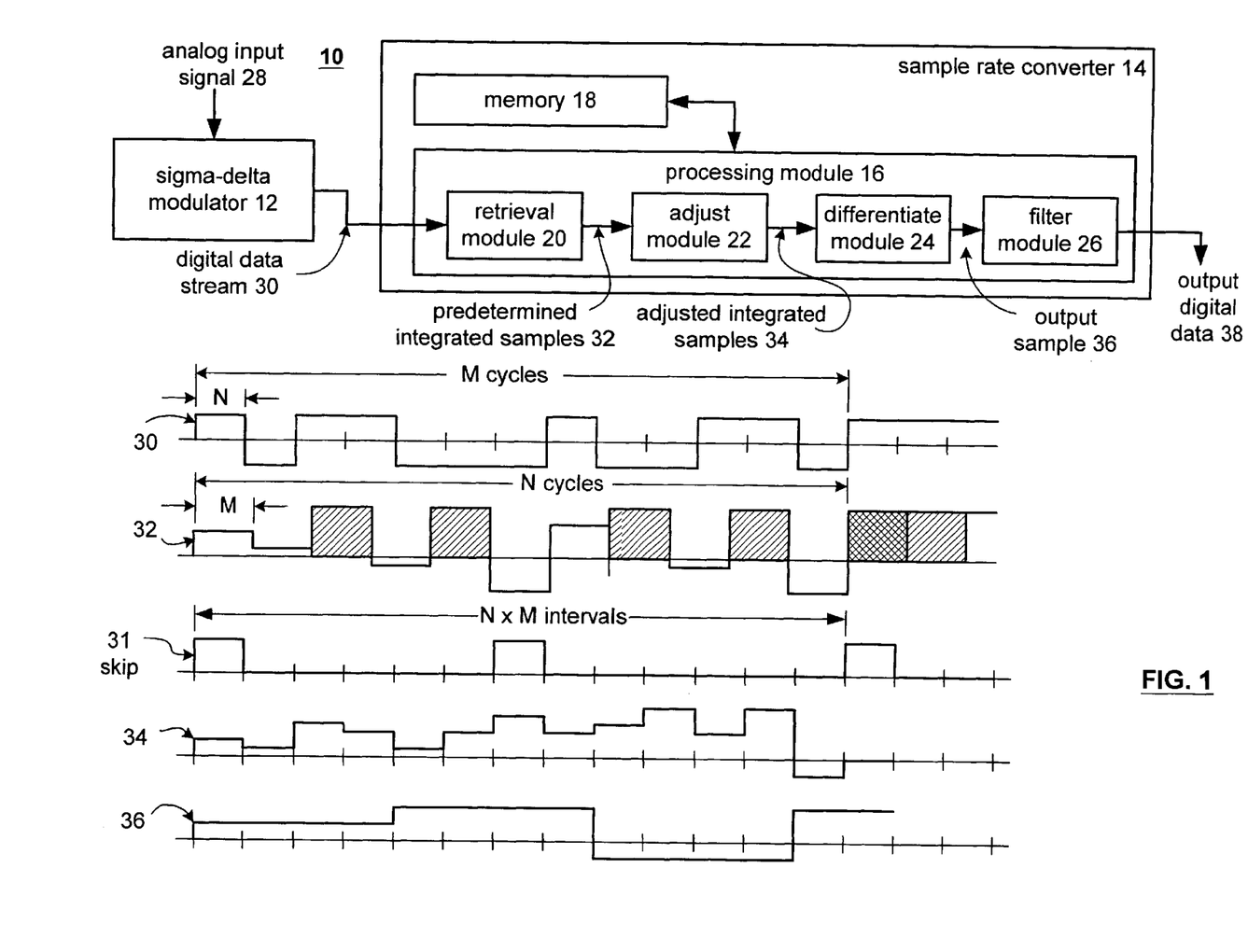
FIG. 1 illustrates a schematic block diagram of an analog to digital converter that includes a sample rate converter in accordance with the present invention.

The present invention can be more fully described with reference to FIGS. 1 through 8. FIG. 1 illustrates a schematic block diagram of an analog to digital converter 10 that may be incorporated in an audio Codec, audio processor, or other mixed signal processing device. The analog to digital converter 10 includes a Sigma Delta modulator 12 and a sample rate converter 14. The Sigma Delta modulator 12 samples the analog input signal 28 at an oversampling rate (e.g., 12.288 MHz or 6.144 MHz) to produce an input digital data stream 30. The construct and functionality of a Sigma Delta modulator is known thus no further discussion will be presented except to further illustrate the concept of the present invention.

The sample rate converter 14 includes a processing module 16 and memory 18. The processing module 16 may be a single processing device or a plurality of processing devices. Such a processing device may be a microprocessor, digital signal processor, microcomputer, central processing unit, logic circuitry, state diagram and/or any device that performs a function based on operational instructions. The memory 18 may be a single memory device or a plurality of memory devices. Such a memory device may be random access memory, read-only memory, floppy disk memory, hard drive memory, reprogrammable memory, circuitry and/or any device that stores operational instructions. Note that when the processing module 16 implements one or more of its functions utilizing a state machine or logic circuitry, the memory storing the corresponding operational instructions is embedded within the circuitry comprising the state machine or logic circuitry.

The sample rate converter 14 is operably coupled to receive the input data stream 30, which is further graphically shown to have a period corresponding to the term N. In practice, the rate of the input data stream 30 corresponds to the oversampling rate of the Sigma Delta modulator 12. In an AC 97 audio Codec environment, the oversampling rate of the Sigma Delta modulator will be a 1/n multiple of 24.576 MHz (e.g., 12.288 MHz or 6.144 MHz). To perform the sample rate conversion, the processing module 16 includes a retrieval module 20, an adjusting module 22, a differentiation module 24 and a filter module 26. The retrieval module 20 is operably coupled to receive the digital data stream 30 and to retrieve predetermined integrated samples 32. Note that sampling having diagonal cross-hatching represent maximum integrated samples and samples having a checkered cross-hatching represents the first sample in a new sequence. The integrated samples 32 are stored in memory associated with the retrieval module 20 and are derived based on the ratio of N to M and the desired output rate of the output digital data 38. As can be seen from the signal diagrams of the digital data stream 30 and the predetermined integrated samples 32, the rate of the predetermined integrated samples is slower than the rate of the digital data stream 30. Even though the rate is slower, the integrated samples are retrieved at the rate of the digital data stream 30. For example, the digital data stream rate may be 12.288 MHz while the rate of the predetermined integrated samples may be 11.29 MHz. Such a ratio is based on an N value of 147 and an M value of 160. Based on these given parameters, the integrated samples may be predetermined. Alternatively, the retrieval module 20 can be replaced with an integrator that includes two stages of integration to produce the integrated samples. The details of generating the predetermined integrated samples will be discussed in greater detail with reference to FIGS. 2 through 8.

The adjusting module 22 receives the predetermined integrated samples 32 and produces adjusted integrated samples 34. In essence, the adjustment module 22 utilizes the data values of the digital data stream 30 to scale and integrate the predetermined integrated samples 32. When the digital data stream 30 is binary, the adjusting integrated samples are the predetermined integrated samples multiplied by plus or minus one in accordance with the data and then integrated.

The differentiation module 24 receives the adjusted integrated samples 32 and produces therefrom output samples 36. The differentiation module 24 is clocked at a 1/n multiplier of the predetermined integrated sample rate 32. In essence, the differentiation module 24 performs two stages of differentiation to obtain the output samples 36. The output samples 36 may be further filtered by filter module 26 to obtain the desired rate for the output digital data 38.

A review of the signal diagrams illustrates that the rate of the digital data stream 30 is faster than the rate of the integrated samples 32. As such, a time will occur when the samples become 360 degrees out of phase. When this occurs, a skip pulse 31 is produced to synchronize the samples 32 with the data stream 30. In general, the skip pulse is asserted when x is less than M–N. As such, the skip pulse is asserted M–N times per sequence.

Figure 2:
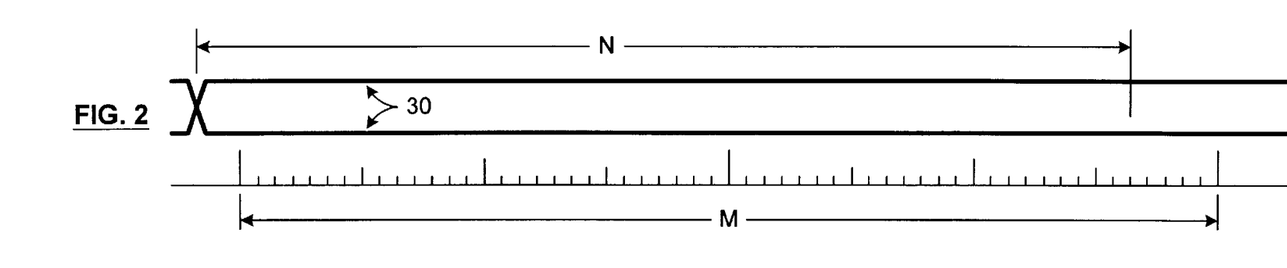
FIG. 2 through 5 illustrate sample rate conversions in accordance with the present invention.

FIGS. 2 through 5 illustrate a sample of the digital data stream 30 and the corresponding interval of the adjusted oversampling rate, which is represented by the period M. FIG. 2 illustrates the condition when the data stream 30 encounters no changes in state for the corresponding period of the adjusted oversampling rate. For the discussions of FIGS. 2 through 5, it is assumed that the value of M is 160 and the value of N equals 147. Based on an M value of 160, the period of the adjusted oversampling rate, i.e., the second sampling rate, is divided into 160 intervals. Based on an N value of 147, the original oversampling rate, i.e., the first sampling rate, is divided into 147 intervals that are the same size as the intervals of the adjusted oversampling rate. Based on these assumptions, the first and second integration samples may be derived for the case of FIG. 2. The first integrated sample $\Sigma_{1new}=\Sigma_{1old}+/-160^2$ or $\Sigma_1+/-25,600$. The second predetermined integrated sample $\Sigma_2=\Sigma_2 +\Sigma_{1old}+/-12,880$. For example, the first integral of +1 for 160 intervals is $$\sum_{i=1}^{160} 1 = 160,$$

while the second integral is $$\sum_{i=1}^{160} i = 160*161/2 = 12,880.$$

These integrated samples will be integrated once each cycle to produce two integrals $\Sigma_{1new}=\Sigma_{1old}+/-160$ and $\Sigma_2=\Sigma_2+160\Sigma_{1old}+/-12,880$. But to avoid the multiplication by 160 in the second integral, the first integral is stored already multiplied by 160 resulting in $\Sigma_{1new}=\Sigma_{1old}+/-160^2$ or $\Sigma_1+/-25,600$ and $\Sigma_2=\Sigma_2+\Sigma_{1old}+/-12,880$.

Figure 3:
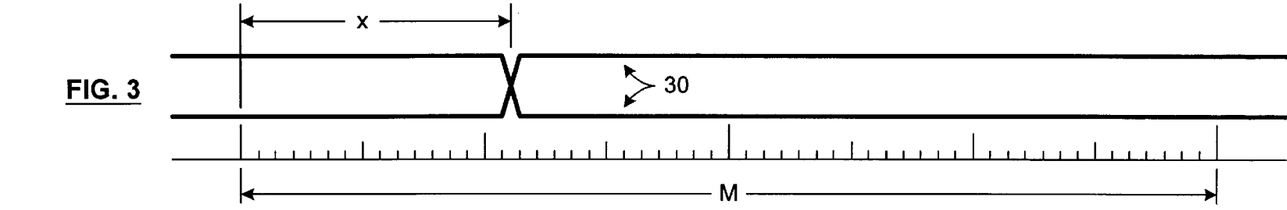
Figure 4:
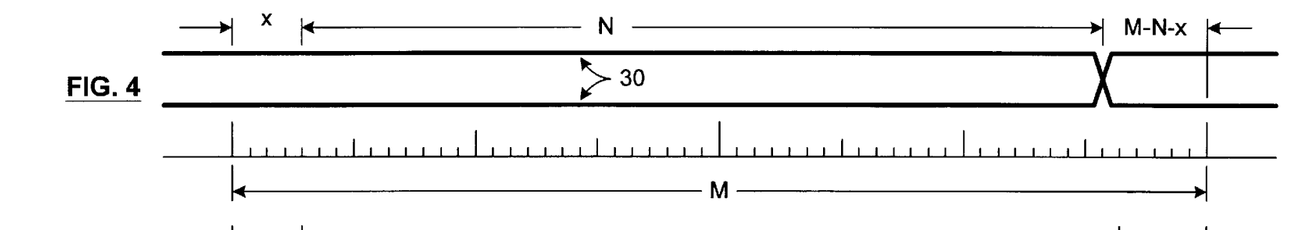

FIG. 3 illustrates the case when the state of the digital data stream 30 changes once during the newly adjusted oversampling rate. In this case, the first integrated sample $\Sigma_{1new}=\Sigma_{1old}+/-(2x-160)*160$, where $1<=x<=159$. The second predetermined integrated sample $\Sigma_2=\Sigma_2+\Sigma_{1old}+/-F_1(x)$ where $F_1(x)=321x-x^2-12,880$. FIG. 4 illustrates a similar condition as that of FIG. 3 and uses the same equations with the substitution of x+147 replacing the term x.

Figure 5:
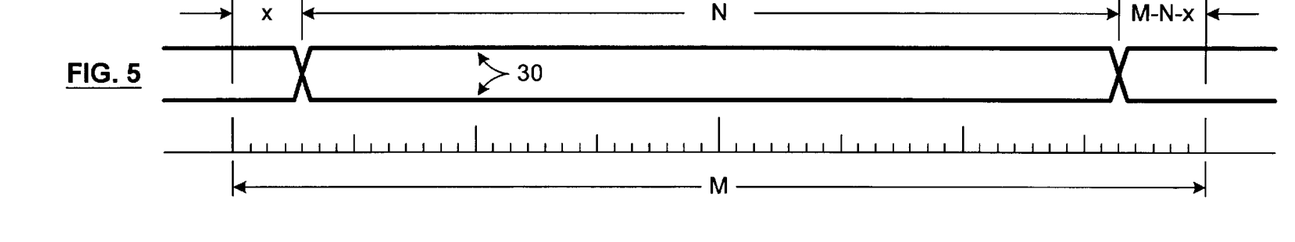

FIG. 5 illustrates the condition when the digital data stream encounters two state changes during one interval of the adjusted oversampling rate. For this condition, the first integrated sample $\Sigma_{1new}=\Sigma_{1old}+/-134*160$ or $\Sigma_{1old}+/-21,440$. The second integrated sample $\Sigma_2=\Sigma_2+\Sigma_{1old}+/-(294x-12,698)$.

From the examples illustrated in FIGS. 2–5, one of average skill in the art will appreciate that sample rate conversion within an ADC can be accomplished by providing predetermined samples to the integration stages of the decimation filter. As is known, one type of decimation filter includes one, or more, stages of integration and a corresponding number of differentiation stages. By pre-calculating the inputs to the first and second integration stages of a decimation filter for each interval relationship of the oversampling rate and the adjusted oversampling rate (0<=x<160 for an M of 160), the predetermined samples can be stored and subsequently retrieved when needed. The predetermined integration samples are stored in a predetermined order such that they may be retrieved in a round robin manner. For example, for an N value of 147 and an M value of 160 and assuming for the first retrieved integration sample the leading edges of the oversampling rate and the adjusted oversampling rate are aligned (e.g., x=0), the next sample would correspond to an interval relationship of x=147, the one after that corresponds to an interval relationship of x=114, and so on.

Thus, the predetermined integrated samples can be retrieved in a round robin manner from memory and used in the integration of the decimation filter unless one of two special conditions arise. The first condition occurs when there is no state change of the oversampling rate for a given period of the adjusted oversampling rate. When this occurs, as shown in FIG. 2, a maximum predetermined integrated sample is retrieved instead of the addressed sample in the round robin. The other condition occurs when there are two state changes of the oversampling rate for a given period of the adjusted oversampling rate. When this condition occurs, as shown in FIG. 5, the providing of the predetermined sample may be skipped or delayed. To accommodate this condition, the samples which correspond to potential interval relationships where two transitions could occur (e.g., 0<=x<=12, for an N of 147 and an M of 160), a skip bit is included to indicate how the retrieved predetermined integration sample is to be processed. As such, the skip bit will indicate whether, when there are two transitions of state, the retrieved sample is to be skipped, delayed for a period of the oversampling rate, or altered to achieve a desired result. One of average skill in the art will appreciate that the predetermined integrated samples could be rounded or truncated to less precision with little or no decrease in the quality of the output data.

Figure 6:
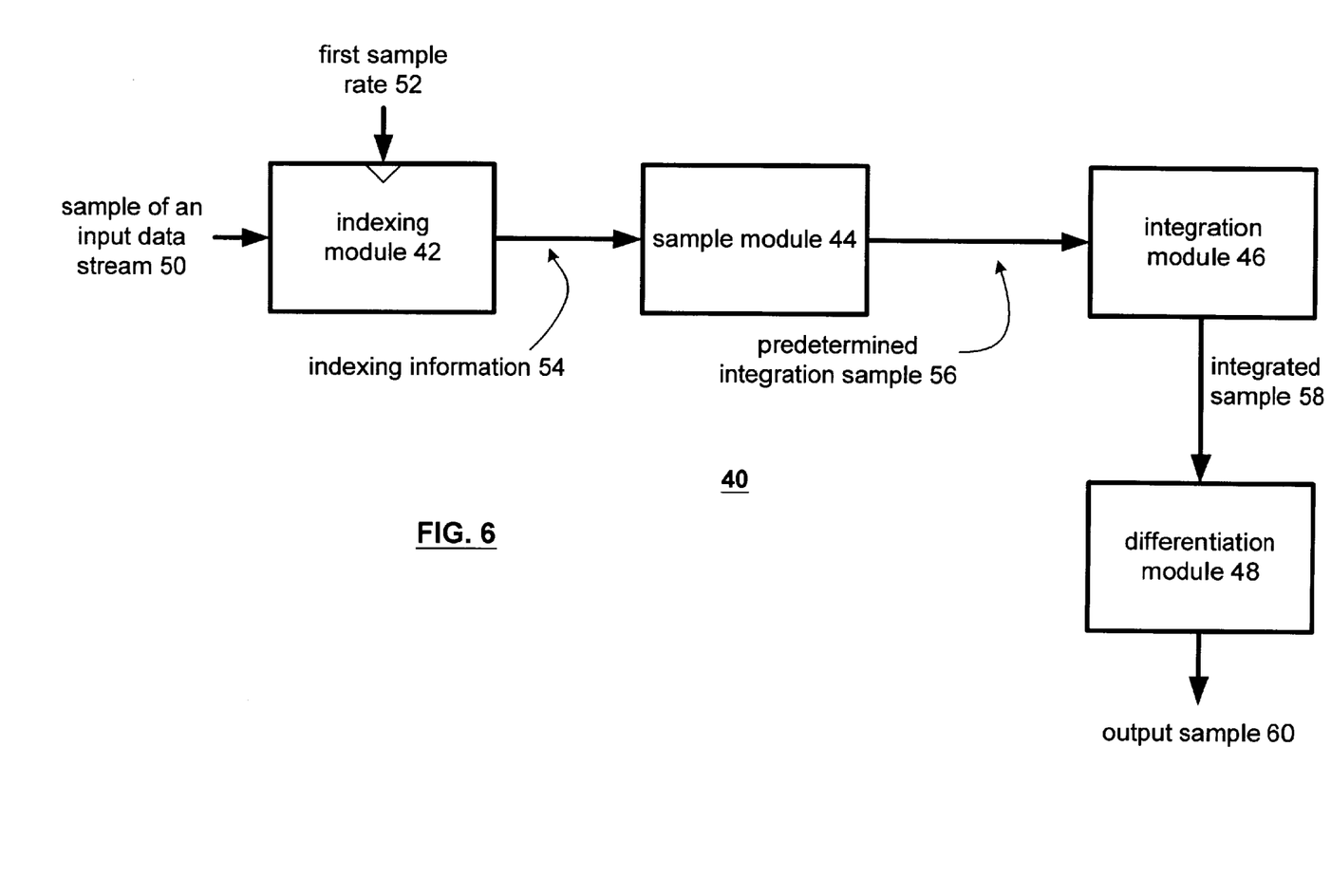
FIG. 6 illustrates a schematic block diagram of a sample rate converter in accordance with the present invention.

FIG. 6 illustrates a schematic block diagram of a sample rate converter 40 that includes an indexing module 42, sampling module 44, integration module 46 and differentiation module 48. The indexing module 42 is operably coupled to receive the first sample of an input data stream 50 at a first sample rate 52. The indexing module 42 generates indexing information 54, which is provided to the sample module 44. In essence, the indexing module 42 based on the sample of the input data determines addressing information to be provided to the sample module 44 and an indication of the value of the sample. Note that the address does not have to depend on the input data value.

The sample module 44 utilizes the indexing information 54 to retrieve a predetermined integration sample 56. The integration sample may be derived in accordance with the discussion presented with reference to FIGS. 2 through 5. Note that if the input data stream includes multi-level data levels, the integration sample 56 would be adjusted accordingly.

The integration module 46 receives the predetermined integration sample 56 and generates an integrated sample 58. In essence, the integration module performs a first and/or second level integration upon the predetermined integration sample, or samples, to obtain the integrated sample. Such an integration module may be found in the front-end of a decimation filter. The integrated sample 58 is then provided to the differentiation module 48 which differentiates the integrated sample 58 to produce an output sample 60, wherein a plurality of the output samples constitutes an output data stream having an output rate that is a 1/n multiple of the second data rate. Note that the differentiation module 48 is typically found in the back-end of the decimation filter.

Figure 7:
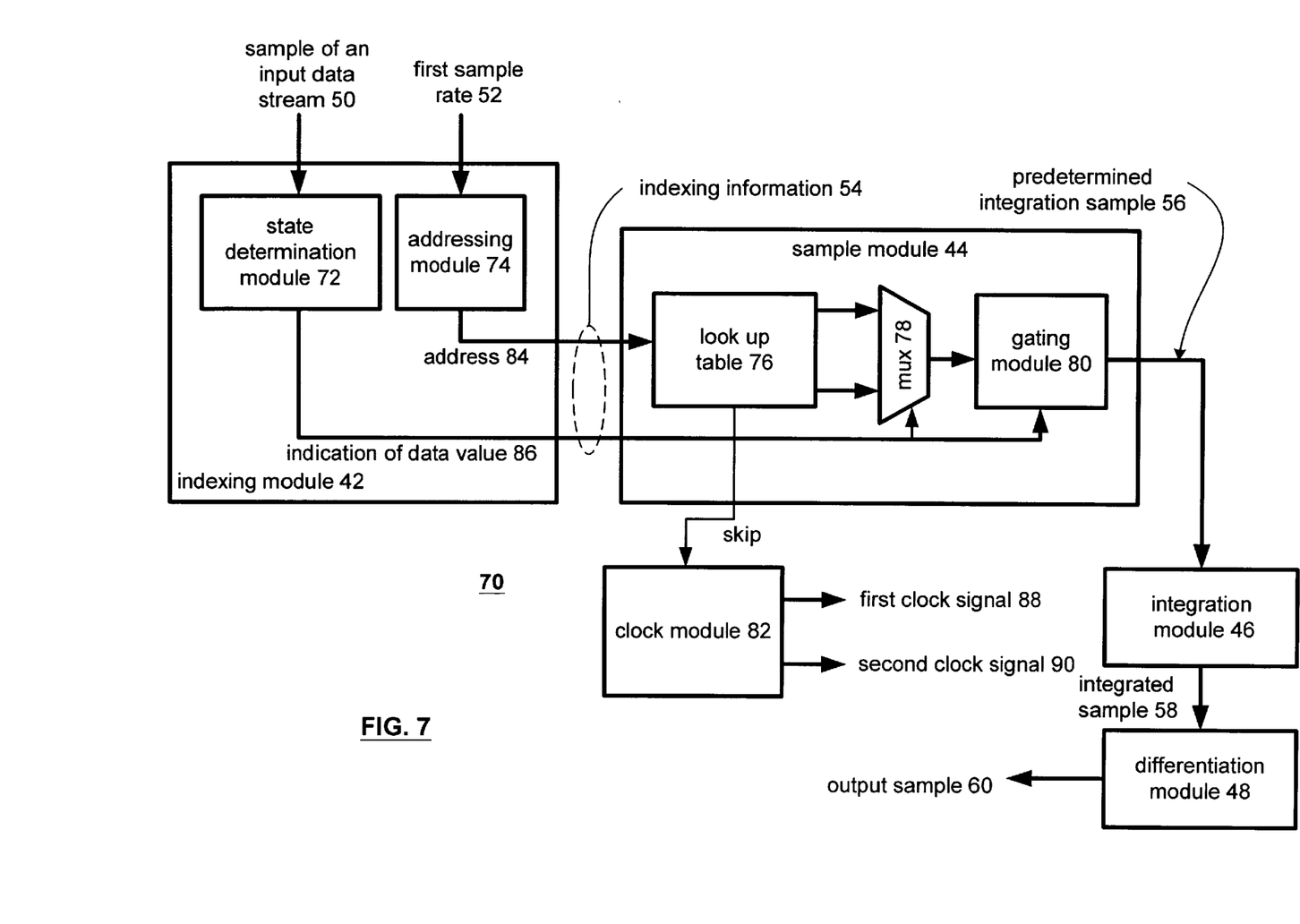
FIG. 7 illustrates a schematic block diagram of another sample rate converter in accordance with the present invention.

FIG. 7 illustrates a schematic block diagram of another sample rate converter that shows greater detail of the indexing module 42 and the sample module 44. The sample rate converter 70 further includes a clock module 82 that generates the first clock signal 88 and a second clock signal 90. The first clock signal 88 is used to provide the first sample rate 52 and the second clock signal 90 provides the second sample rate, or the adjusted oversampling rate. Note that the adjusted oversampling rate may be generated by inhibiting a pulse of the first sampling rate clock when the skip pulse is asserted and passing the pulses of the first sampling rate clock when the skip pulse is not asserted. As shown, the indexing module 42 includes an addressing module 74 and a state determination module 72. The addressing module 74 is clocked based on the first sample rate and generates addresses 84. The addresses 84 may be produced in a round robin fashion that are provided to a look-up table 76 within the sample module 44. The state determination module 72 produces an indication of the data value 86 of samples of the input data stream 50. This indication is provided to a gating module 80 of sample module 44.

The sample module 44 includes the look-up table 76, a multiplexor 78 and the gating module 80. The look-up table 76, based on the address outputs a corresponding predetermined integrated sample that is based on the equations explained above with reference to FIGS. 2 through 6. In essence, the predetermined integration sample corresponds to the $\Sigma_1$ and $\Sigma_2$ values derived above. In addition, the lookup table also outputs a maximum value that corresponds to no change in the state of the digital input data stream 50 during a given interval of the second sampling rate. The multiplexor 78 selects the integrated sample or a maximum integrated sample based on no transitions of the input data stream occurring during a given period of the second clock rate. In an embodiment of the sample rate converter, the integrated sample may be determined in a 2-step process when <M−N (i.e., when the skip pulse is asserted). The first step is to calculate the integral assuming that the data sample will not change at the M−N−x point. The second step is to adjust the integral if the data does change at the M−N−x point. The first integral and the adjustment are stored in consecutive locations in memory with skip set for the first location. In addition, when the skip pulse is asserted, the adjusted clock skips a pulse relative to the first clock so two cycles are available to produce the integral.

The selected integration sample is provided to the gating module 80 which, for binary signals, multiplies the integrated sample by 1 or minus 1 to produce the predetermined integration sample 56. Note that the gating module 80 may include a multiplier that multiplies the output multiplexor 78 with the indication of the data value or the data value of a given sample to produce a predetermined integration sample 56. The remaining portion of the sample rate converter 70 functions as described with reference to FIG. 6.

Figure 8:
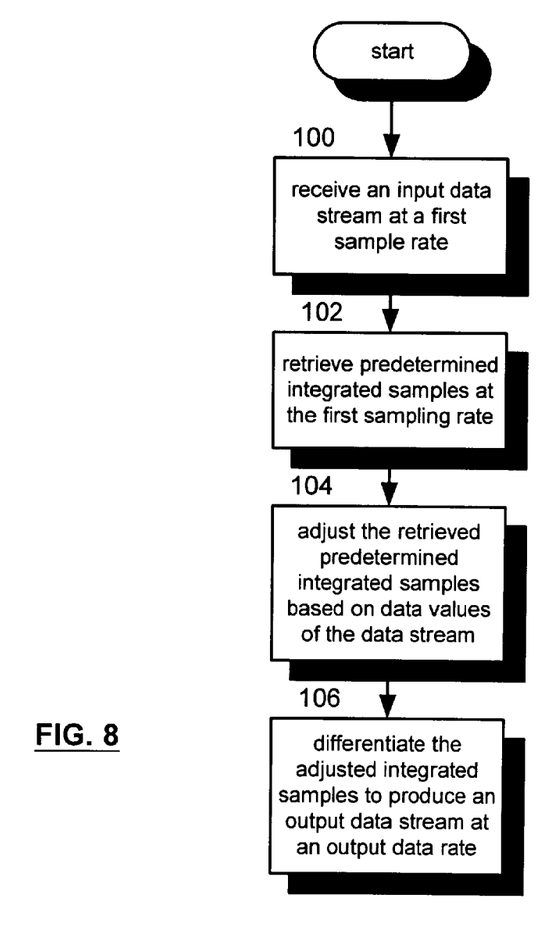
FIG. 8 illustrates a logic diagram of a method for sample rate conversion in accordance with the present invention.

FIG. 8 illustrates a logic diagram of a method for sample rate conversion in accordance with the present invention. Such processing, which may be executed by the processing module 16, begins at step 100 where an input data stream is received at a first sample rate (e.g., an oversampling rate that is a 1/n multiple of a master clock). The input data stream may be received from the output of a Sigma Delta modulator, a binary digital data stream and/or a multi-level digital data stream. The process then proceeds to step 102 where predetermined integrated samples are retrieved at the first sampling rate. Typically, a single predetermined integrated sample will be retrieved for each sample of the input data stream.

The process then proceeds to step 104 where the retrieved predetermined integrated samples are adjusted based on data values of the data stream. The adjusted integrated sample is based on a first integration of a first one of the retrieved integration samples and performing a second integration of the previous result of the first integration and a second one of the predetermined integrated samples. The resultant of the second integration may be then adjusted in accordance with the equations previously discussed.

The process then proceeds to step 106 where the adjusted integrated sample is differentiated to produce an output data stream at an output data rate. Note that the second sample rate is a multiple of the output sample rate. Further note that the predetermined integrated samples are derived based on a ratio between the first sample rate and the second sample rate. This was illustrated above with reference to FIGS. 2 through 5. The process also includes determining whether a skip bit for a given one of the predetermined integrated samples is set. When the skip bit is set, the differentiation of one of the input intervals is delayed. Such delaying adjusts for the different interval rates between the first and second samples.

The preceding discussion has presented a method and apparatus for sample rate conversion utilizing predetermined integrated samples. As such, the predetermined integrated samples may be stored in memory and retrieved in a round robin fashion and adjusted based on state changes of a first sample rate signal. With such an implementation, the use of a clock that exceeds one GHz is avoided as are costs of such a clock.

What is claimed is:

1. A method for converting sample rates, the method comprises the steps of:
   a) receiving an input data stream at a first sample rate;
   b) retrieving predetermined integrated samples at the first sample rate, wherein the predetermined integrated samples are derived based on a ratio between the first sample rate and a second sample rate;
   c) adjusting the retrieved predetermined integrated samples based on data values of the input data stream to produce adjusted integrated samples; and
   d) differentiating the adjusted integrated samples to produce an output data stream at an output sample rate, wherein the second sample rate is a multiple of the output sample rate.

2. The method of claim 1, wherein step (a) further comprises receiving the input data stream as at least one of: an output from a sigma delta modulator, a binary digital data stream, and a multi-level digital data stream.

3. The method of claim 2, wherein step (c) further comprises, at a given sample, multiplying at least one of the data values and the at least one of the retrieved predetermined integrated samples to yield a product and integrating the product to produce one of the adjusted integrated samples.

4. The method of claim 2, wherein step (c) further comprises, at a given sample for a binary digital data stream or the output from a sigma delta modulator,
negating the at least one of the retrieved predetermined integrated samples when the data sample is negative one or zero, and
passing the at least one of the retrieved predetermined integrated samples when the data sample is positive one.

5. The method of claim 1, wherein step (b) further comprises retrieving at least one predetermined integrated sample for each sample at the first sample rate.

6. The method of claim 5, further comprises retrieving at least one other corresponding predetermined integrated sample for each sequential sample at the first sample rate.

7. The method of claim 1, wherein step (b) further comprises:
   determining whether sequential samples of the input data stream are at different states; and
   when the states of the two sequential samples are the same, retrieving a maximum integrated sample as the retrieved predetermined integrated sample for a first one of the sequential samples.

8. The method of claim 1, wherein step (d) further comprises:
   determining whether a skip bit for a given one of the predetermined integrated samples is set, wherein the skip bit indicates at least one of: when beginning and ending of a sample of the input data stream occurs within an interval of the second sample rate and when the beginning of the sample of the input data stream is aligned with the beginning of the interval of the second sampling rate; and
   when the skip bit is set, delaying the differentiation for one input sample interval.

9. A method for converting an analog signal into a digital signal, the method comprises the steps of:
   a) sigma delta modulating, at a first sample rate, the analog signal to produce a plurality of samples;
   for each of the plurality of samples;
   b) retrieving at least one of a plurality of predetermined integrated samples, wherein the plurality of predetermined integrated samples are derived based on a ratio between the first sample rate and a second sample rate;
   c) adjusting the at least one of the plurality of predetermined integrated samples based on a data value for a current one of the plurality of samples to produce an adjusted integrated sample;
   d) differentiating the adjusted integrated sample to produce an output sample; and
   e) filtering the output sample to produce a filtered sample, wherein a plurality of filtered samples constitute the digital signal having an output rate, wherein the second sample rate is a multiple of the output rate.

10. The method of claim 9, wherein step (c) further comprises integrating the at least one of the predetermined integrated samples to produce the adjusted integrated sample.

11. The method of claim 9,
   wherein step (b) further comprises retrieving two predetermined integrated samples;
   wherein step (c) further comprises:
      integrating a first one of the two predetermined integrated samples to produce a first integrated result; and
      integrating a combination of the first integrated result and the second of the two predetermined samples to produce the adjusted integrated sample;

wherein step (d) further comprises:
  differentiating the adjusted sample to produce a first differentiated result; and
  differentiating the first differentiated result to produce the output sample.

12. A sample rate converter comprises:
  sample module that provides, based on indexing information, at least one of a plurality of predetermined integrated samples, wherein the plurality of integrated samples are based on a ratio between a first sample rate and a second sample rate;
  indexing module operably coupled to receive an input data stream at the first sample rate, wherein the indexing module generates the indexing information at least partially based on a data value of each sample of the input data stream;
  an integration module operably coupled to receive the at least one of the plurality of predetermined integrated samples and to produce therefrom an integrated sample; and
  a differentiation module operably coupled to receive the integrated sample and to produce therefrom an output sample, wherein a plurality of output samples constitute an output data stream having an output data rate, wherein the second data rate is a multiple of the output data rate.

13. The sample rate converter of claim 12, wherein the sample module further comprises:
  a look up table that stores the plurality of predetermined integrated samples; and
  multiplexor operably coupled to the look up table, wherein the multiplexor outputs a maximum predetermined integrated value as the at least one of the plurality of predetermined integrated samples when the indexing information is indicative that consecutive samples of the input data stream are of the same state, and wherein the multiplexor outputs a next predetermined integrated value as the at least one of the plurality of predetermined integrated samples when the indexing information is indicative of a single state change between the consecutive samples.

14. The sample rate converter of claim 13, wherein the sample module further comprises:
  a gating module operably coupled to receive an output of the first multiplexor, wherein the gating module negates the at least one of the plurality of predetermined integrated samples when a current sample of the input data stream has a negative data value, and wherein the gating module passes the at least one of the plurality of predetermined integrated samples when the current sample has a positive data value.

15. The sample rate converter of claim 13, wherein the sample module further comprises:
  a multiplier that multiplies the at least one of the plurality of predetermined integrated samples and the data value of the current sample.

16. The sample rate converter of claim 12, wherein the indexing module further comprises:
  an addressing module that generates addresses in a round robin manner for consecutive samples of the input data stream; and
  state determination module operably coupled to determine the data value of at least one consecutive sample of the input data stream, wherein the state determination module generates an indication of the data value for the consecutive sample, and wherein the address for the consecutive sample and the indication of the data value for the consecutive sample constitute the indexing information.

17. The sample rate converter of claim 12 further comprises a clock module operably coupled to the sample module, the integration module, and the differentiation module, wherein the clock module provides a first clock signal having the first sample rate, and a second clock signal having the output sample rate, wherein the second clock is generated by producing a gated clock signal, wherein the first clock signal is inhibited when a skip bit is set during one of the predetermined integrated samples, and the first clock signal is passed when the skip bit is not set, and dividing the gated clock signal by an integer value to produce the second clock signal.

18. A sample rate converter comprises:
  a processing module; and
  memory operably coupled to the processing module, wherein the memory stores operational instructions that cause the processing module to: (a) receive an input data stream at a first sample rate; (b) retrieve predetermined integrated samples at the first sample rate, wherein the predetermined integrated samples are derived based on a ratio between the first sample rate and a second sample rate; (c) adjust the retrieved predetermined integrated samples based on data values of the input data stream to produce adjusted integrated samples; and (d) differentiate the adjusted integrated samples to produce an output data stream at an output sample rate, wherein the second sample rate is a multiple of the output sample rate.

19. The sample rate converter of claim 18, wherein the memory further comprises operational instructions that cause the processing module to adjust the retrieved predetermined integrated sample by multiplying, at a given sample, at least one of the data values and the at least one of the retrieved predetermined integrated samples to produce a product and integrating the product to produce one of the adjusted integrated samples.

20. The sample rate converter of claim 18, wherein the memory further comprises operational instructions that cause the processing module to adjust the retrieved predetermined integrated sample by, at a given sample for a binary digital data stream or an output from a sigma delta modulator,
  negating the at least one of the retrieved predetermined integrated samples when the data sample is negative one or zero,;
  passing the at least one of the retrieved predetermined integrated samples when the data sample is positive one; and
  integrating a result to produce one of the adjusted integrated samples.

21. The sample rate converter of claim 18, wherein the memory further comprises operational instructions that cause the processing module to retrieve at least one predetermined integrated sample for each sample at the first sample rate and to retrieve at least one other corresponding predetermined integrated sample for each sequential sample at the first sample rate.

22. The sample rate converter of claim 18, wherein the memory further comprises operational instructions that cause the processing module to:
  determine whether sequential samples of the input data stream are at different states; and when the states of the two sequential samples are the same, retrieve a maximum integrated sample as the retrieved predetermined integrated sample for a first one of the sequential samples.

23. The sample rate converter of claim 18, wherein the memory further comprises operational instructions that cause the processing module to:

determine whether a skip bit for a given one of the predetermined integrated samples is set, wherein the skip bit indicates at least one of: when beginning and ending of a sample of the input data stream occurs within an interval of the second sample rate and when the beginning of the sample of the input data stream is aligned with the beginning of an interval of the second sample rate; and when the skip bit is set, delay the differentiation for one input sample interval.

24. An analog to digital converter comprises:

a sigma delta modulator operably coupled to receive an analog input signal and to output a digital data stream representative of the analog input signal, wherein the digital data stream has a first data rate;

a processing module; and memory operably coupled to the processing module, wherein the memory stores operational instructions that cause the processing module to, for each of sample of the digital data stream, (a) retrieve at least one of a plurality of predetermined integrated samples, wherein the plurality of predetermined integrated samples are derived based on a ratio between the first sample rate and a second sample rate; (b) adjust the at least one is of the plurality of predetermined integrated samples based on a data value for a current sample of the digital data stream to produce an adjusted integrated sample; (c) differentiate the adjusted integrated sample to produce an output sample; and (d) filter the output sample to produce a filtered sample, wherein a plurality of filtered samples constitute an output digital data stream having an output rate, wherein the second sample rate is a multiple of the output rate.

25. The analog to digital converter of claim 24, wherein the memory further comprises operational instructions that cause the processing module to integrate the at least one of the predetermined integrated samples to produce the adjusted integrated sample.

26. The analog to digital converter of claim 24, wherein the memory further comprises operational instructions that cause the processing module to:

retrieve two predetermined integrated samples as the at least one of the plurality of predetermined integrated samples;

adjust the two predetermined integrated samples by:
integrating a first one of the two predetermined integrated samples to produce a first integrated result; and
integrating a combination of the first integrated result and the second of the two predetermined integrated samples to produce the adjusted integrated sample;

differentiate the adjusted integrated sample by:
differentiating the adjusted integrated sample to produce a first differentiated result; and
differentiating the first differentiated result to produce the output sample.

* * * * *